United States Patent
Knoefler

(10) Patent No.: US 7,217,619 B2
(45) Date of Patent: May 15, 2007

(54) METHOD FOR FABRICATING MEMORY COMPONENTS

(75) Inventor: Roman Knoefler, Fishkill, NY (US)

(73) Assignee: Infineon Technologies AG, Munich (DE)

( * ) Notice: Subject to any disclaimer, the term of this patent is extended or adjusted under 35 U.S.C. 154(b) by 213 days.

(21) Appl. No.: 10/954,157

(22) Filed: Sep. 29, 2004

(65) Prior Publication Data

US 2005/0106815 A1    May 19, 2005

(30) Foreign Application Priority Data

Sep. 29, 2003    (DE) .................. 103 45 237

(51) Int. Cl.
*H01L 21/336*    (2006.01)
(52) U.S. Cl. .............. 438/261; 438/288; 438/722; 438/737; 438/785; 438/786
(58) Field of Classification Search .............. 438/216, 438/261, 287–288, 723–724, 785–786, 722, 438/737
See application file for complete search history.

(56) References Cited

U.S. PATENT DOCUMENTS

| 6,346,442 | B1 | 2/2002 | Aloni et al. | |
|---|---|---|---|---|
| 6,440,798 | B1 | 8/2002 | Lai et al. | |
| 6,448,126 | B1 | 9/2002 | Lai et al. | |
| 6,448,137 | B1 | 9/2002 | Lai et al. | |
| 6,468,865 | B1 | 10/2002 | Yang et al. | |
| 6,509,604 | B1 * | 1/2003 | Pham et al. ............. | 257/316 |
| 6,511,882 | B1 | 1/2003 | Kuo et al. | |
| 2003/0036234 | A1 * | 2/2003 | Doi ........................ | 438/266 |
| 2003/0036275 | A1 | 2/2003 | Lai et al. | |
| 2005/0014335 | A1 * | 1/2005 | Goldbach et al. ........ | 438/257 |
| 2005/0191808 | A1 * | 9/2005 | Steimle et al. ........... | 438/260 |
| 2005/0224865 | A1 * | 10/2005 | Lee et al. ................ | 257/324 |
| 2005/0237801 | A1 * | 10/2005 | Shih ...................... | 365/185.11 |

* cited by examiner

*Primary Examiner*—M. Wilczewski
*Assistant Examiner*—Toniae M. Thomas
(74) *Attorney, Agent, or Firm*—Slater & Matsil, L.L.P.

(57) ABSTRACT

The top of the semiconductor body (1) has a sacrificial layer (4) made of nitride applied to it on a region, which is provided for the actuation circuit. A memory layer (6) provided for the memory cells is applied over the entire area and is removed above the sacrificial layer (4) by dry etching. The nitride in the sacrificial layer (4) can then be removed by wet chemical means without starting to etch the semiconductor material.

16 Claims, 2 Drawing Sheets

METHOD FOR FABRICATING MEMORY COMPONENTS

This application claims priority to German Patent Application 103 45 237.0, which was filed Sep. 29, 2003, and is incorporated herein by reference.

TECHNICAL FIELD

The present invention relates generally to semiconductor components, and more particularly to a system and method for fabricating memory components.

BACKGROUND

In the case of semiconductor memory components, a top of a semiconductor body or substrate made of semiconductor material holds a memory cell array comprising memory cells each of which has a transistor structure and is addressed using word lines and bit lines. Programming, reading and erasing are performed using a logic circuit in an actuation peripheral area. This circuit is normally constructed using CMOS transistors. Although the actuation components and the memory cells have a homogeneous transistor structure in principle, the transistors in the logic circuit need to have a special gate dielectric (gate oxide) provided on the top of the semiconductor body, while the memory cells require a memory layer or memory layer sequence for the programming operation. Such a memory layer may be a floating gate electrode, for example, which is embedded in dielectric material between the gate electrode and the channel region of the transistor in question.

In the case of charge trapping memory cells, the gate dielectric provided is a layer sequence that has a memory layer between limiting layers. The memory layer is dielectric material, but may also be intrinsically conductive (undoped) silicon. Such a cell is programmed by injecting hot, i.e., energy-rich, electrons from the channel region through the bottom-limiting layer of the memory layer sequence into the memory layer. Such memory cells are known as SONOS memory cells, in which the memory layer sequence comprises a nitride layer as memory layer between limiting layers made of oxide.

A limiting layer made of oxide in the memory layer sequence cannot normally be used as gate oxide for the transistors in the actuation peripheral area. It is, therefore, necessary to produce separate oxide layers or other dielectric layers for the transistors in the memory cell array and for the transistors in the actuation circuit.

Fabrication processes customary to date first of all involve the memory layer or memory layer sequence being produced on the top of the semiconductor body over the entire area. Outside the memory cell array, this memory layer is removed. In the case of an oxide/nitride/oxide memory layer sequence, this is preferably done by wet chemical means, because this is the best way of preventing damage to the semiconductor body as a result of etching the surface. In principle, this etching may also be performed using a dry etching process; in this case, however, the problem of possible substrate damage arises.

The memory layer sequence in a charge trapping memory cell can also be produced from other materials. In conjunction with silicon oxide as limiting layers, the memory layer arranged in between may be, by way of example, a material from the group comprising tantalum oxide, hafnium silicate, titanium oxide ($TiO_2$ in the case of stoichiometric composition), zirconium oxide ($ZrO_2$ in the case of stoichiometric composition), alumina ($Al_2O_3$ in the case of stoichiometric composition) and intrinsically conductive silicon. The limiting layers used may also be oxynitride instead of oxide.

In future technologies, an oxynitride/$Al_2O_3$/oxynitride layer sequence is particularly preferred for the memory layer sequence of the charge trapping memory cells. $Al_2O_3$ can be etched other than by wet chemical means using conventional photomasks. It is also difficult to remove oxynitrides by wet chemical means using lacquer masks. The memory layer sequence therefore needs to be removed from the semiconductor body in the region of the actuation peripheral area by means of dry etching.

SUMMARY OF THE INVENTION

In one aspect, the present invention specifies a way in which a memory layer provided for a memory cell array in a semiconductor memory component can be removed in the region of the actuation peripheral area such that there is no risk of substrate damage.

A preferred embodiment method first of all involves a sacrificial layer being applied in the region provided for the actuation or logic circuit. Only then is the memory layer or memory layer sequence supplied over the entire area. Using a mask, the memory layer outside the memory cell array can be removed by means of a dry etching process without attacking the semiconductor body as a result. In the region of the actuation circuit, the sacrificial layer forms a protective layer against the etching attack. Only when the memory layer has been removed in the region of the actuation circuit, in which case the sacrificial layer may have been etched at the same time, is the sacrificial layer removed by wet chemical means. This is done in the manner known per se, particularly when nitride is chosen as the material for the sacrificial layer. The wet chemical etching then takes place in comparable fashion to the case of a nitride layer applied as memory layer, which is removed by wet chemical means. A memory layer sequence comprising materials other than oxide and nitride may therefore also be removed in the region of the actuation circuit by means of a dry etching process. The use of the sacrificial layer means that the other method steps, particularly implantations for forming doped regions in the semiconductor material, are not impaired. In a simple case, a suitable sacrificial layer is also a pad oxide layer, which is applied to the top of the semiconductor body at the beginning.

BRIEF DESCRIPTION OF THE DRAWINGS

More detailed explanations of examples of the method now follow with reference to FIGS. 1 to 6.

DETAILED DESCRIPTION OF ILLUSTRATIVE EMBODIMENTS

Figure 1:
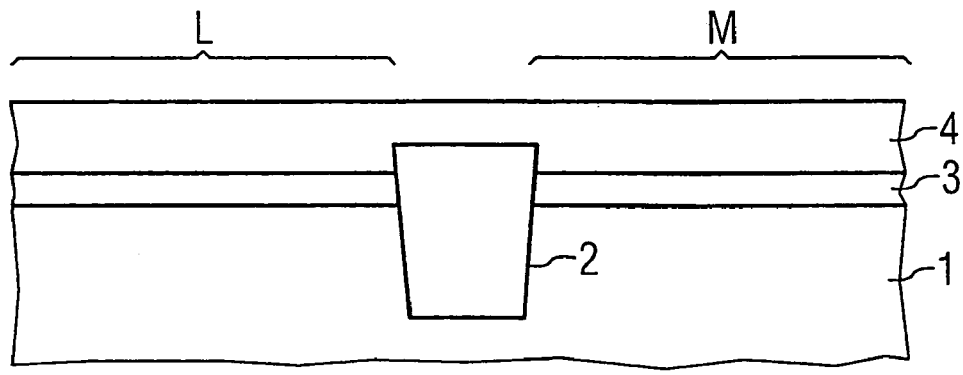
FIG. 1 shows an arrangement with the sacrificial layer in cross-section.

FIG. 1 shows, in cross-section, a semiconductor body 1 in which an STI (Shallow Trench Isolation) insulation 2 has been used to isolate a region M provided for the memory cell array from the region L provided for the actuation peripheral area of the logic circuit. A pad oxide layer 3 may have been applied to the top of the semiconductor body 1. The pad oxide layer 3 may also have been omitted. If a pad oxide layer 3 has been provided, it may also already be used as sacrificial layer in the method. The preferred method illustrated with reference to the figures involves a separate sacrificial layer 4 first being applied over the entire area, however. This sacrificial layer 4 may be a nitride, for example, particularly a pad nitride layer which has been applied in correspondingly greater thickness. The typical thickness of this sacrificial layer is approximately 20 nm, for example.

Figure 2:
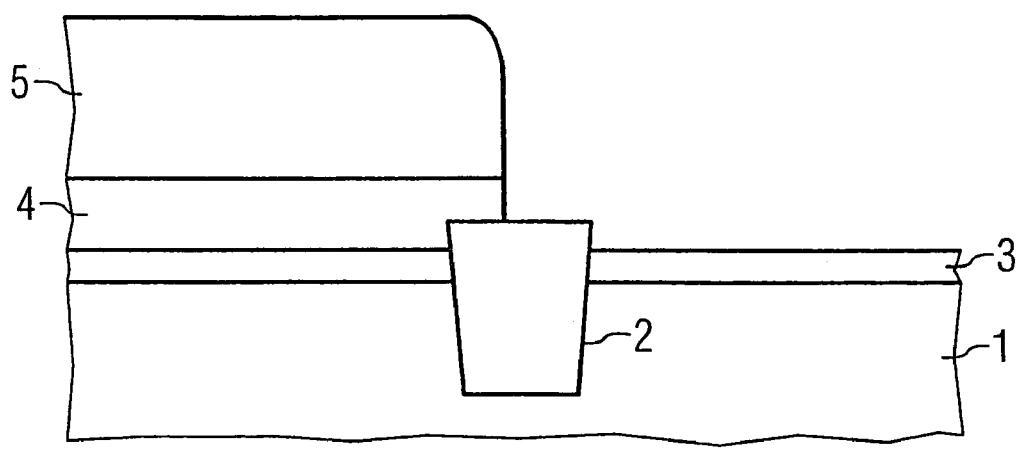
FIG. 2 shows the cross-section from FIG. 1 following removal of the sacrificial layer in the memory cell array.

FIG. 2 shows a cross-section through the arrangement after a lacquer mask 5 (e.g., photoresist) has been applied and patterned, the lacquer mask then being used to remove the sacrificial layer 4 in the region M provided for the memory cell array. In the example illustrated, the pad oxide layer 3 has therefore been exposed again in the region M. This method step is carried out such that the sacrificial layer 4 is left at least in the region of the logic circuit L which is provided for actuation components.

The sacrificial layer 4 can be removed in the region M by dry etching or wet chemical etching. This is followed by removal of the photoresist mask 5. In the region M of the memory cell array, the pad oxide layer 3 is likewise removed, which is preferably done by wet chemical means and preferably after the photoresist mask 5 has been removed. The region L provided for the actuation or logic circuit then contains the remaining components of the pad oxide layer 3 and of the sacrificial layer 4. As already indicated, the sacrificial layer 4 may also have been omitted, in principle, if there is a pad oxide layer. If a sacrificial layer 4 is applied, the pad oxide layer may be omitted, on the other hand, the associated method steps are omitted. The process sequence illustrated with reference to the figures is the preferred exemplary embodiment, however.

Figure 3:
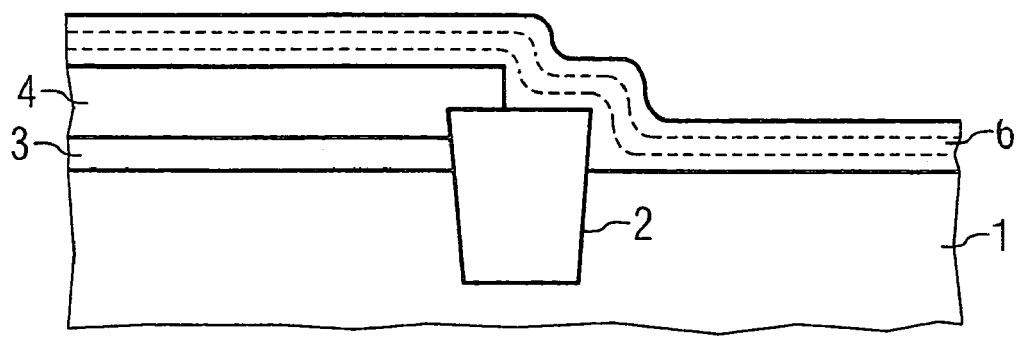
FIG. 3 shows the structure from FIG. 2 after the memory layer has been applied.

FIG. 3 shows a cross-section through the arrangement when the memory layer or memory layer sequence 6 has been applied over the entire area. This may be a single-ply or multi-ply layer, in principle, as indicated by the dashed lines in FIG. 3. This method is particularly advantageous if the memory layer sequence 6 comprises a material other than oxide and nitride, particularly $Al_2O_3$ or another material, such as tantalum oxide, hafnium silicate, titanium oxide ($TiO_2$ in the case of stoichiometric composition), zirconium oxide ($ZrO_2$ in the case of stoichiometric composition), alumina ($Al_2O_3$ in the case of stoichiometric composition) and intrinsically conductive silicon. In FIG. 3, it can clearly be seen that the memory layer or memory layer sequence 6 is applied to the sacrificial layer 4 in the region of the peripheral area provided for the actuation or logic circuit.

Figure 4:
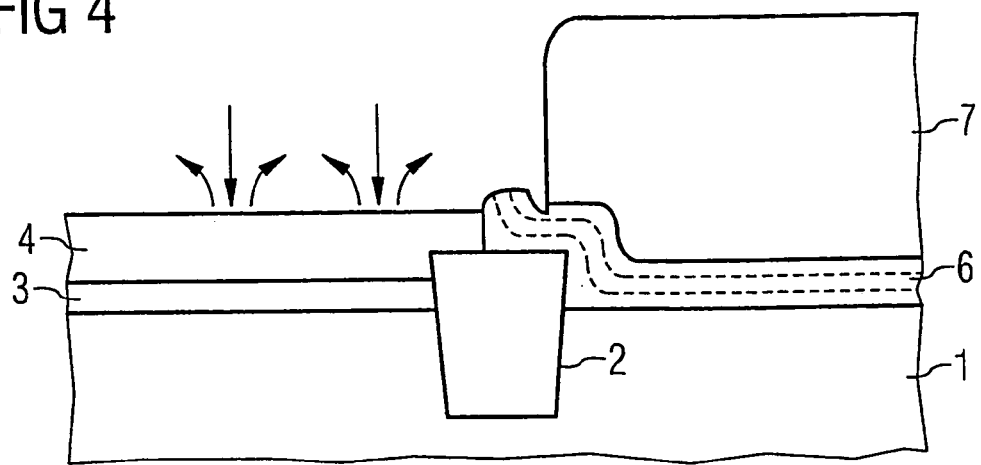
FIG. 4 illustrates the method step in which the sacrificial layer is removed.

FIG. 4 shows the cross-section from FIG. 3 after a further photoresist mask 7 has been applied and patterned, the further photoresist mask not covering the region L which is provided for the actuation or logic circuit and in which the CMOS transistors are intended to be formed. In this region, the memory layer or memory layer sequence 6 is removed by a dry etching process, which is indicated in FIG. 4 by the arrows, which are shown. In this method step, the sacrificial layer 4 can be etched (over etch), which ensures complete removal of the memory layer or memory layer sequence in this region. This does not damage the semiconductor body 1 since the minimum remaining residue of the layer component of the sacrificial layer 4 provides adequate protection against the etching attack. Subsequently, the further photoresist mask 7 is removed.

Figure 5:
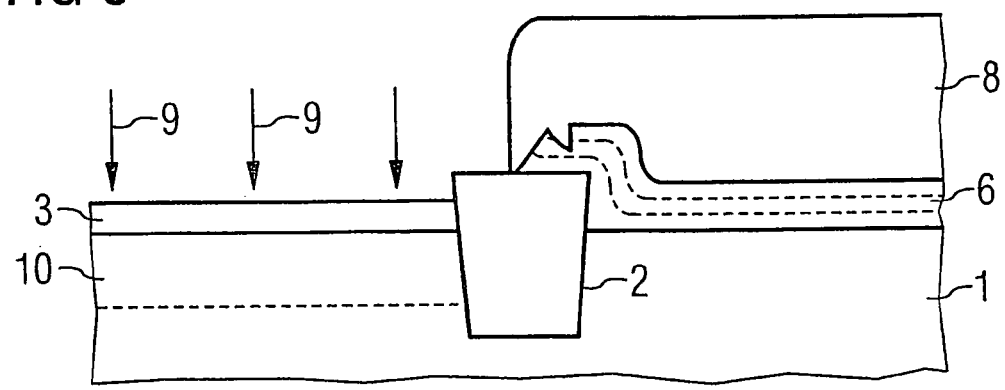
FIG. 5 illustrates a method step in which implantations are performed.

In line with the illustration in FIG. 5, the sacrificial layer 4 is then removed. This is preferably done by wet chemical means so as to damage the semiconductor body 1 as little as possible. The material for the sacrificial layer is preferably chosen such that it can be removed selectively for the memory layer or memory layer sequence in this method step, specifically without using a further lacquer mask. In the exemplary embodiment described, which has a memory layer sequence with an oxide layer as the top limiting layer, a sacrificial layer made of nitride is therefore expedient. The use of a material, which can be etched selectively for oxide for the sacrificial layer 4 has the additional advantage that the sacrificial layer 4 can be etched highly selectively for the oxide of the pad oxide layer 4. The pad oxide layer 3 is therefore an effective etching stop layer, and the semiconductor material is not attacked.

A further photoresist mask 8, which covers the memory cell array can then be applied and patterned again. This is followed by customary method steps, such as implantations 9 for forming doped regions 10 in the region of the logic circuit. These method steps are performed in the manner known per se from production of the actuation circuit. The pad oxide layer 3 is then also removed in this region L for the actuation or logic circuit. If appropriate, this method step may involve the concomitant removal of a residual layer component (which also remained in the region L at first) of the memory layer or memory layer sequence 6, e.g. material of a bottom-limiting layer made of oxide.

Figure 6:
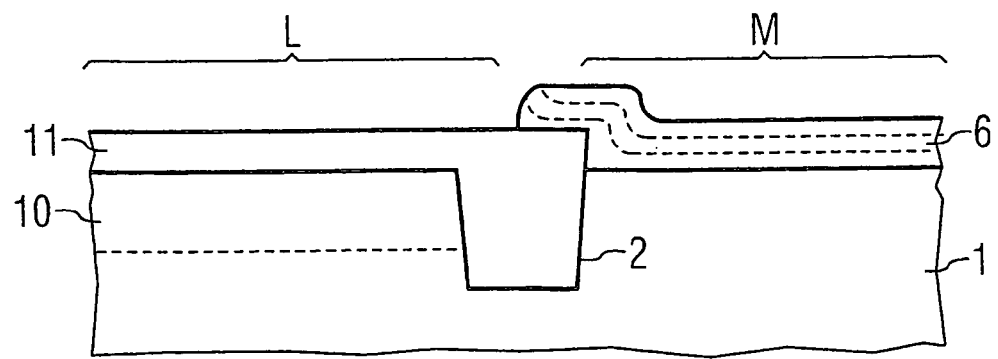
FIG. 6 shows the structure following the production of the gate oxide layer for the logic circuit in cross-section.

FIG. 6 shows the cross-section of the component after a gate dielectric, particularly a gate oxide 11, has been produced for the CMOS components in the region L provided for the actuation or logic circuit. This is done in the manner known per se from production of these components. The region M provided for the memory cell array contains the memory layer or memory layer sequence 6 which is likewise used as a gate dielectric for the memory transistors. Subsequently, the remaining method steps for producing the components of the logic circuit can take place in the manner which is known per se.

The sacrificial layer may be silicon nitride, for example, which is produced using LPCVD (Low Pressure Chemical Vapor Deposition). The sacrificial layer may also be part of a layer stack, e.g., comprising silicon oxide and silicon nitride, as shown in the exemplary embodiment. In a simple case, a pad nitride which has been applied anyway, e.g., from a process for STI production, may be used as the sacrificial layer in the region of the actuation circuit. Particularly, a memory layer sequence, which is used for charge trapping memory cells such as NROM memory cells or SONOS memory cells, comprising oxide, nitride and oxide or other materials suitable for this purpose, can be removed in the region of the actuation peripheral area using this method. The method simplifies the use of novel materials for the memory layer sequence.

The method provides a series of advantages. These include, in particular, the option of complete removal of the layer stack of the memory layer sequence by means of dry etching, including over etching into the sacrificial layer acting as protective layer. In addition, etching the substrate using the dry etching process and contamination of the semiconductor material of the substrate during dry etching are avoided, which may otherwise result in problems particularly when an $Al_2O_3$ layer is used as memory layer.

What is claimed is:

1. A method for fabricating memory components, in which a semiconductor body or substrate has a memory layer or memory layer sequence applied to it in a memory region provided for a memory cell array, and a gate dielectric layer for transistors is produced in a logic region provided for an actuation or logic circuit, the method comprising:
   applying a pad oxide layer over said memory region and said logic region of said substrate;
   applying a separate sacrificial layer on said pad oxide layer;
   applying a memory layer or a memory layer sequence that includes a memory layer over the memory region and the logic region;
   dry etching to completely remove the memory layer or the memory layer of the memory layer sequence in the logic region while leaving at least a residual layer portion of said sacrificed layer; and
   wet etching to remove said at least a residual layer portion of the sacrificial layer.

2. The method as claimed in claim 1, wherein applying a sacrificial layer comprises applying a sacrificial layer using a material that can be etched selectively at least for a layer component of the memory layer or memory layer sequence.

3. The method as claimed in claim 1, wherein applying a sacrificial layer comprises applying a layer stack.

4. The method as claimed in claim 3, wherein the layer stack comprises different materials.

5. The method as claimed in claim 1, wherein applying a sacrificial layer comprises providing a layer or layer sequence for one or more further fabrication steps and leaving the layer or layer sequence as a sacrificial layer.

6. The method as claimed in claim 1, wherein applying said sacrificial layer comprises applying a pad oxide layer and/or a pad nitride layer as a sacrificial layer or as a layer component of the sacrificial layer.

7. The method as claimed in claim 1, wherein applying a memory layer or memory layer sequence comprises applying a memory layer or memory layer sequence that is provided for forming charge trapping memory cells.

8. The method as claimed in claim 7, wherein applying a memory layer or memory layer sequence comprises applying a memory layer sequence comprising a first oxide layer a memory layer made of a material selected from the group consisting of tantalum oxide, hafnium silicate, titanium oxide, zirconium oxide, alumina and intrinsically conductive silicon, and a second oxide layer.

9. The method as claimed in claim 7, wherein applying a memory layer or memory layer sequence comprises applying a memory layer sequence that comprises a memory layer made of $Al_2O_3$ between limiting layers made of oxide or oxynitride.

10. A method of forming a memory device, the method comprising:
   providing a semiconductor body that includes a memory region and a logic region;
   forming a pad oxide layer over said memory region and logic region of said substrate;
   forming a sacrificial layer on top of said pad oxide layer and over the logic region and the memory region;
   completely removing said pad oxide layer and said sacrificial layer from said memory region;
   forming a memory layer over the logic region and over the memory region, the memory layer overlying the sacrificial layer in the logic region;
   dry etching to completely remove the memory layer from over the logic region;
   wet etching to remove the sacrificial layer from over the logic region;
   forming a memory cell in the memory region; and
   forming a logic device in the logic region.

11. The method of claim 10 wherein the sacrificial layer comprises a nitride layer.

12. The method of claim 10 wherein the memory layer comprises a sequence of layers.

13. The method of claim 12 wherein the memory layer comprises a first oxide layer, a storage layer over the first oxide layer, and a second oxide layer over the storage layer, the storage layer comprising aluminum and oxygen.

14. The method of claim 12 wherein the memory layer comprises a first oxynitride layer, a storage layer over the first oxynitride layer, and a second oxynitride layer over the storage layer, the storage layer comprising aluminum and oxygen.

15. The method of claim 10, wherein the memory layer comprises at least one material selected from the group consisting of tantalum oxide, hafnium silicate, titanium oxide, zirconium oxide, alumina and intrinsically conductive silicon.

16. A method of forming a memory device, the method comprising:
   providing a semiconductor body that includes a memory region and a logic region, the semiconductor body further including a isolation region between the memory region and the logic region;
   forming a pad oxide layer over said memory region and said logic region of said semiconductor body;
   forming a sacrificial layer over the logic region and the memory region;
   forming a resist layer over the logic region and the memory region;
   patterning the resist layer to expose the memory region but not the logic region;
   completely removing the pad oxide layer and the sacrificial layer from the memory region;
   removing remaining portions of the resist;
   forming a memory layer that includes a storage layer over the logic region and over the memory region, the memory layer overlying the sacrificial layer in the logic region, the storage layer comprising at least one material selected from the group consisting of tantalum oxide, hafnium silicate, titanium oxide, zirconium oxide, alumina and intrinsically conductive silicon;
   dry etching to completely remove the memory layer from over the logic region;
   wet etching to remove the pad oxide layer and the sacrificial layer from over the logic region;
   forming a gate dielectric over the logic region;
   forming a charge trapping memory cell in the memory region; and
   forming a logic circuit in the logic region.

* * * * *